(12) United States Patent
Zare-Hoseini et al.

(10) Patent No.: US 9,184,713 B2
(45) Date of Patent: Nov. 10, 2015

(54) LOW DISTORTION AMPLIFIER

(75) Inventors: Hashem Zare-Hoseini, Cambridge (GB); Ian Sabberton, Cambridge (GB)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 1178 days.

(21) Appl. No.: 13/141,045

(22) PCT Filed: Nov. 26, 2009
(Under 37 CFR 1.47)

(86) PCT No.: PCT/GB2009/051607
§ 371 (c)(1),
(2), (4) Date: Nov. 29, 2011

(87) PCT Pub. No.: WO2010/070315
PCT Pub. Date: Jun. 24, 2010

(65) Prior Publication Data
US 2012/0249235 A1 Oct. 4, 2012

(30) Foreign Application Priority Data

Dec. 19, 2008 (GB) .................................. 0823251.4

(51) Int. Cl.
*H03F 1/36* (2006.01)
*H03G 1/04* (2006.01)
(Continued)

(52) U.S. Cl.
CPC ............... *H03G 1/04* (2013.01); *H03F 1/3211* (2013.01); *H03G 1/0088* (2013.01)

(58) Field of Classification Search
CPC ........................................................ H03F 1/36

USPC ...................... 330/86, 85, 83, 98, 150, 310
See application file for complete search history.

(56) References Cited

U.S. PATENT DOCUMENTS

| 4,855,685 A | 8/1989 | Hochschild et al. |
| 4,885,687 A | 12/1989 | Carey |

(Continued)

FOREIGN PATENT DOCUMENTS

| CN | 1494763 | 5/2004 |
| JP | 61242405 A | 10/1986 |

OTHER PUBLICATIONS

Search Report issued May 3, 2013 in corresponding Chinese matter.

*Primary Examiner* — Henry Choe
(74) *Attorney, Agent, or Firm* — Procopio, Cory, Hargreaves & Savitch, LLP

(57) ABSTRACT

A variable gain amplifier circuit (200) comprising an amplifier element (202) having an input (208, 210) and an output (220, 222); a feedback loop (224, 226) having a feedback impedance (228, 230) connected between the input (208, 210) and output (232, 234) of the amplifier element (202); an input branch (212, 214) having an input resistance connected between an input of the variable gain amplifier circuit and the input (208, 210) of the amplifier element (202); and a plurality of switches for selecting a gain of the variable gain amplifier circuit (200); characterised in that the variable gain amplifier circuit (200) further comprises an intermediate element (204) having an input and an output, the input being connected to a node between one of the switches and the feedback impedance (228, 230), such that the output can provide a signal which can be used to attenuate a signal component in the output (220, 222) of the amplifier element (202) caused by a non-linearity in the plurality of switches.

9 Claims, 3 Drawing Sheets

(51) Int. Cl.
   *H03G 1/00*   (2006.01)
   *H03F 1/32*   (2006.01)

(56) References Cited

U.S. PATENT DOCUMENTS

| | | |
|---|---|---|
| 5,903,191 A | 5/1999 | Gosser |
| 5,955,919 A | 9/1999 | Lubbe et al. |
| 7,352,238 B2 * | 4/2008 | Elwan .................. H03G 1/0088 330/144 |
| 8,410,846 B2 * | 4/2013 | Zare-Hoseini ........... H03G 5/00 327/337 |
| 8,497,791 B2 * | 7/2013 | Okumura ............ H03F 3/45475 330/86 |
| 2002/0149423 A1 | 10/2002 | Prentice et al. |
| 2005/0191981 A1 | 9/2005 | Kahl et al. |
| 2005/0264360 A1 | 12/2005 | Ma et al. |

* cited by examiner

LOW DISTORTION AMPLIFIER

REFERENCE TO RELATED APPLICATION

The present application is a National Stage of International Patent Application No. PCT/GB2009/051607, filed Nov. 26, 2009, published on Jun. 24, 2010, as WO 2010/070315A1, whose disclosure is hereby incorporated by reference in its entirety into the present disclosure.

The present invention relates to an amplifier circuit and to an integrated circuit comprising such an amplifier circuit.

It is commonplace in audio and radio applications for an electronic amplifier to be used to amplify or attenuate an input signal. This allows a signal of an appropriate amplitude to be output to further signal processing components downstream of the amplifier. Typically the amplifier is a variable gain amplifier, such that input signals of varying amplitude can be received and amplified or attenuated as appropriate to ensure maximum signal to noise ratio (SNR).

The voltage gain of a variable gain amplifier is usually determined by a feedback network, which may comprise an input resistance and a resistance in a feedback loop connected between an input and an output of the amplifier. Typically the feedback resistance is fixed, whilst the input resistance can vary. It is common for a plurality of input branches to be provided in parallel, each branch containing a different resistance and a switch, such that a desired gain value can be achieved by closing the switch in one of the plurality of input branches to connect a desired resistance to the input of the amplifier.

The switches used in the input branches are usually metal oxide semiconductor (MOS) transistors, which can give rise to difficulties, as the on-resistance of the transistors is often non-linear, i.e. the resistance between the drain and source (or equivalent) when the transistor is switched on varies as a function of the current flowing through the transistor, which in turn is a function of the signal input to the amplifier. As the input to the amplifier is typically a signal of varying amplitude, the on-resistance of the transistor varies, leading to variations in the gain of the amplifier and thus distortion in the output signal.

A solution to this problem is illustrated schematically in FIG. 1. In this circuit, a variable gain amplifier forms part of an integrator. In the circuit shown generally at 10, a plurality of input branches 12, 14, 16 contain input resistances 18, 20, 22, whose values are scaled with respect to one another. Thus, in branch 12 the input resistance 18 has a value R, whilst in branch 14 the input resistance 20 has a value nR, where the scaling factor n may be an integer, and in branch 16 the input resistance 22 has a resistance mR, where the scaling factor m may be an integer.

The input branches 12, 14, 16 each contain an input transistor 24, 26, 28 in series with the respective input resistance 18, 20, 22, which operates as a switch, such that the input resistances 18, 20, 22 can be selectively connected to an input 30 of an operational-amplifier (op-amp) 32. The respective input transistors 24, 26, 28 are configured such that their on-resistances are scaled using the same scaling factors n, m as the input resistances 18, 20, 22 in the respective input branches 12, 14, 16. Thus, the input transistor 24 in input branch 12 has an on-resistance of S, whilst the input transistor 26 in input branch 14 has an on-resistance of nS and the input transistor 28 in input branch 16 has an on-resistance of mS.

A feedback loop 34 containing a capacitor 36 is provided between the input 30 and an output 38 of the op-amp 32. Feedback branches 40, 42, 44 connect the feedback loop 34 to nodes intermediate the input resistances 18, 20, 22 and the input transistors 24, 26, 28 of each input branch 12, 14, 16, and each of the feedback branches 40, 42, 44 is provided with a feedback transistor 46, 48, 50 which acts as a switch such that the input resistances 18, 20, 22 can be selectively connected to the feedback loop 34. The on-resistances of the respective feedback transistors 46, 48, 50 are scaled using the same scaling factors n, m as the input resistances 18, 20, 22 and the input transistors 24, 26, 28. Thus, the feedback transistor 46 in feedback branch 40, which connects input resistance 18 to the feedback loop 34, has an on-resistance of S'. The feedback transistor 48 in feedback branch 42, which connects input resistance 20 to the feedback branch 34 has an on-resistance of nS', and the feedback transistor 50 in feedback branch 44, which connects the input resistance 22 to the feedback path 34, has an on-resistance of mS'.

In the circuit 10 of FIG. 1, the common scaling factors of the respective input resistances 18, 20, 22, input transistors 24, 26, 28 and feedback transistors 46, 48, 50 ensure that any non-linearity in the input transistors 24, 26, 28 has no effect on the output of the op-amp 32. Any non-linearity in the feedback transistors 46, 48, 50 results only in an additive non-linearity at the output of the op-amp 32, which can be rectified downstream of the op-amp 32.

This solution is effective in reducing non-linearity in integrator circuits such as that shown in FIG. 1. However, where a resistive feedback element is used in place of the capacitor 36, there is no advantage to this system, as non-linearities in the feedback transistors 40, 42, 44 cause distortion in the output of the op-amp 32.

According to a first aspect of the invention there is provided a variable gain amplifier circuit comprising an amplifier element having an input and an output; a feedback loop having a feedback impedance connected between the input and output of the amplifier element; an input branch having an input resistance connected between an input of the variable gain amplifier circuit and the input of the amplifier element; and a plurality of switches for selecting a gain of the variable gain amplifier circuit; characterised in that the variable gain amplifier circuit further comprises an intermediate element having an input and an output, the input being connected to a node between one of the switches and the feedback impedance, such that the output can provide a signal which can be used to attenuate a signal component in the output of the amplifier element caused by a non-linearity in the plurality of switches.

The variable gain amplifier circuit of the present invention attenuates signal components in the output of the first amplifier which are caused by non linearities in the feedback switches, such that distortion in the output of the circuit is reduced in comparison to prior art systems. Unlike prior art systems, the circuit of the present invention can be used in any application where extremely low harmonic distortion is required.

A plurality of parallel input branches may be provided, each input branch containing an input resistance and an input switch, such that the gain of the amplifier circuit can be selected by operation of one or more of the input switches.

The resistance values of the input resistances and the on-resistance values of the corresponding input switches in the input branches may be scaled by common scaling factors.

The on-resistance of the feedback switches in the feedback branches corresponding to the input branches may be scaled by scaling factors corresponding to those of the input resistance values and the on-resistance values of the input switches in the corresponding input branches.

The input switches may comprise transistors.

The intermediate element may comprise a voltage to current converter.

The voltage to current converter may comprise a degenerated pair of transistors.

The amplifier element may comprise an operational amplifier.

The circuit may be a differential amplifier circuit.

According to a second aspect of the invention there is provided an integrated circuit comprising a variable gain amplifier circuit according to the first aspect of the invention.

Embodiments of the invention will now be described, strictly by way of example only, with reference to the accompanying drawings, of which FIG. 1 is a schematic representation of a prior art circuit for reducing the effect of non-linearities in the input of a variable gain amplifier which forms part of an integrator;

Figure 2:
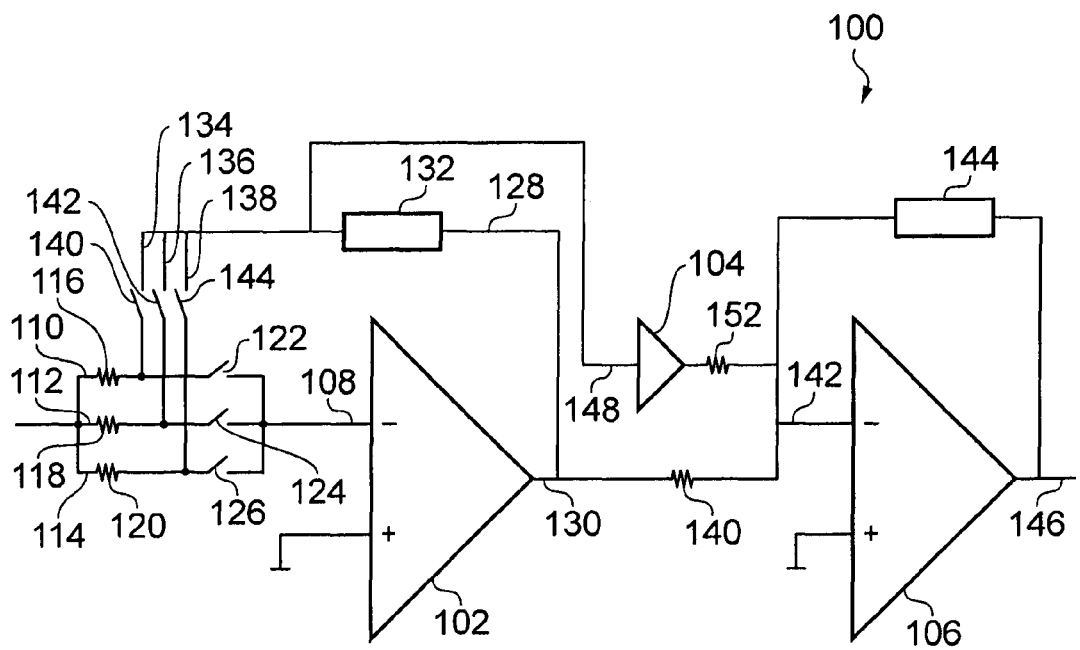
FIG. 2 is a schematic representation of an embodiment of a variable gain amplifier circuit.

Referring now to FIG. 2, a variable gain amplifier circuit according to an embodiment of the invention is shown generally at 100. The circuit 100 comprises an input amplifier 102, which in this example is an operational amplifier (op-amp), an intermediate amplifier 104 and an output amplifier 106, which in this example is an op-amp.

An input 108 of the input op-amp 102 is connected to a plurality of parallel input branches 110, 112, 114, with each of the parallel input branches 110, 112, 114 containing an input resistance 116, 118, 120, which may be, for example, a printed resistor. Each of the input branches also contains an input transistor 122, 124, 126 operating as a switch, by means of which the input 108 of the input op-amp 102 can be connected to one of the input branches 110, 112, 114 and the input resistance 116, 118, 120 contained therein.

The values of the input resistances 110, 112, 114 are scaled with respect to one another. In this example the value of the input resistance 110 is R, whilst the value of the input resistance 112 is nR. Input resistance 114 has a value of mR, where n and m are scaling factors which may be integers.

The input transistors 122, 124, 126 each have an on-resistance, and the on-resistances of the input transistors 122, 124, 126 are scaled with respect to one another using the scaling factors used to scale the corresponding input resistances 110, 112, 114 with respect to one another. Thus, the on-resistance of input transistor 122 is S, whilst the on-resistance of the input transistor 124 is nS and the resistance of the input transistor 126 is mS. The on-resistance of the input transistors 122, 124, 126 can be selected by varying the silicon area occupied by the transistor 122, 124, 126, as will be familiar to those skilled in the relevant art.

The circuit 100 has a first feedback loop 128 which connects the input 108 of the input op-amp 102 to an output 130 of the input op-amp 102. The first feedback loop 128 contains a first feedback impedance 132. Feedback branches 134, 136, 138 connect the first feedback loop 128 to nodes between the input resistances 116, 118, 120 and the input transistors 122, 124, 126 of each input branch 110, 112, 114, and each of the feedback branches 134, 136, 138 is provided with a feedback transistor 140, 142, 144 which acts as a switch such that the input resistances 116, 118, 120 can be selectively connected to the first feedback loop 128. In this example, the on-resistances of the feedback transistors 140, 142, 144 are scaled using the scaling factors n, m used to scale the corresponding input resistances 116, 118, 120 and the input transistors 122, 124, 126. Thus, the feedback transistor 140 in feedback branch 134, which connects input resistance 116 to the feedback loop 128, has an on-resistance of S'. The feedback transistor 142 in feedback branch 136, which connects input resistance 118 to the feedback branch 136 has an on-resistance of nS', and the feedback transistor 144 in feedback branch 138, which connects the input resistance 120 to the feedback path 128, has an on-resistance of mS'. As will be appreciated by those skilled in the relevant art, the on-resistances of the feedback transistors 140, 142, 144 may be selected by varying the silicon area of the transistors 140, 142, 146.

The output 130 of the input op-amp 102 is connected to an input 142 of the output op-amp 106 by means of a resistance 140. In this embodiment the output op-amp 106 is configured as a fixed-gain amplifier, having a feedback impedance 144 connected between the input 142 and an output 146 of the output op-amp 102. However, it will be appreciated that the output op-amp 106 may be differently configured so as to serve a different purpose, for example as an integrator.

The intermediate amplifier 104 is configured as a unity gain inverting amplifier (i.e. an amplifier having a gain of −1), and has an input 148 which is connected to a node between the feedback branches 134, 136, 138 and the feedback impedance 132 of the feedback loop 128 of the input op-amp 102. An output 150 of the intermediate amplifier 104 is connected to the input 142 of the output op-amp 106 via a resistance 152.

The purpose of the intermediate amplifier 104 is to provide a signal which can be used to negate or attenuate any effects in the signal output by the input op-amp 102 caused by non-linearities in the feedback transistors 140, 142, 144, as will be explained below.

Figure 1:
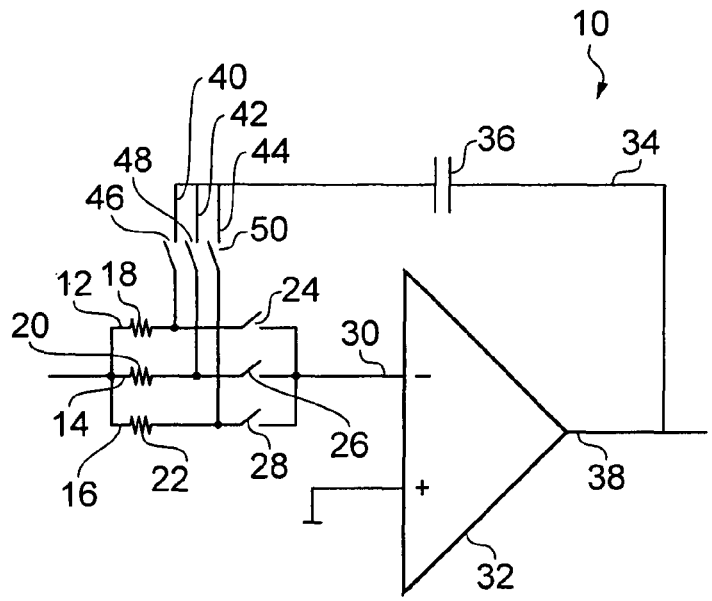

As in the prior art system discussed above in relation to FIG. 1, the common scaling factors of the on-resistances of the input transistors 122, 124, 126 and the corresponding input resistances 116, 118, 120 in the input branches 110, 112, 114 ensure that any non-linearities in the input transistors 122, 124, 126 do not give rise to any non-linear effects in the signal output by the input op-amp 102.

In use of the circuit 100, one or more of the input transistors 122, 124, 126 will be switched on to select an input resistance 116, 118, 120, thereby setting the gain of the input op-amp 102, whilst one or more of the feedback transistors 140, 142, 144 will also be switched on to select a feedback branch 134, 136, 138. In this way the gain of the variable gain amplifier circuit 100 is selected.

For the purposes of the following explanation, the input op-amp 102 will be treated as an ideal op-amp. The impedance at the input 108 of the input op-amp 102 is infinite, meaning that no current can enter the input 108 of the input op-amp 102. This in turn means that the voltage at the nodes between the resistances 116, 118, 120 and the corresponding input transistors 122, 124, 126 of the input branches 110, 112, 114 will always be equal to the voltage at the input 108 of the input op-amp, when one of the input transistors 122, 124, 126 is switched on. Thus, a current which is inversely proportional to the selected input resistance 116, 118, 120 is passed to the first feedback loop 128. As no current passes through the selected input transistor 122, 124, 126, any variation in its on-resistance caused by non-linearities in the input transistors 122, 124, 126 cannot have any effect on the signal output by the input op-amp 102.

However, any non-linearities in the selected feedback transistor 140, 142, 144 will have an effect on the signal output by the input op-amp 102. Consider a situation in which input transistor 122 is switched on to select input resistance 116 and feedback transistor 140 is switched on to select feedback branch 134. The current $i_1$ entering the feedback branch 134 is $$i_1 = \frac{V_{in}}{R},$$

where $V_{in}$ is the voltage at the input of the circuit 100 and R is the value of the resistance 116.

The voltage $V_f$ at a node in the feedback loop 128 between the feedback branch 134 and the feedback impedance is $V_f = i_1 S'$, where S' is the on-resistance of the feedback transistor 140.

It will be appreciated that a similar voltage will be present whichever of the input resistances 110, 112, 114 is selected by switching on the corresponding input transistor 122, 124, 126 and the corresponding feedback transistor 140, 142, 144.

In the embodiment illustrated in FIG. 2, the voltage $V_f$, which is caused by the on-resistance of the selected feedback transistor 140, 142, 144 is added to the signal output by the input op-amp 102. Thus, $V_{out1} = HV_{in} + V_f$, where $V_{out1}$ is the voltage at the output 130 of the input op-amp 102, H is the variable gain of the input op-amp 102 and $V_{in}$ is the voltage at the input of the variable gain amplifier 100. The input op-amp 102 is assumed to be an ideal op-amp, so the voltage at the inverting input 108 is equal to the voltage at the non-inverting input, which in this case is 0 v.

As $V_f$ varies according to the input signal due to the non-linearities of the feedback transistors 140, 142, 144, the signal at the output 108 of the input op-amp will be distorted.

The intermediate amplifier 104 is configured as a unity gain inverting amplifier, and its input 148 is connected to a node between the feedback switches 140, 142, 144 and the feedback impedance 132. Thus, the voltage at the input 148 is $V_f$. As the intermediate amplifier 104 has a gain of −1, the voltage at its output 150 is $-V_f$.

The output 150 of the intermediate amplifier 104 and the output 130 of the input amplifier are connected to the input 142 of the output amplifier 106. The output amplifier is assumed to be an ideal op-amp, so the voltage $V_{op2}$ at the inverting input 142 of the output amplifier 106 is equal to the voltage at the inverting input of the output amplifier 106, which in this case is 0 v. The current entering the feedback impedance 144 of the output amplifier 106 is $$i_{fop2} = \frac{V_{out1}}{R_2} - \frac{V_f}{R_2} = \frac{HV_{in} + V_f}{R_2} - \frac{V_f}{R_2} = \frac{HV_{op}}{R_2},$$

where R2 is the resistance of the resistors 140 and 152.

It will be clear from the analysis above that the current entering the feedback impedance 144 of the output amplifier 106 is not dependent upon the voltage Vf, which is caused by non-linearities in the feedback transistors 140, 142, 144. The intermediate amplifier 104 thus provides a signal which can be used to negate or at least attenuate the signal in the output 108 of the input op-amp 102 caused by non-linearities in the feedback transistors 140, 142, 144.

The output op-amp 106 is configured in this example as a fixed-gain amplifier, and thus amplifies the signal at its input 142 by a fixed gain. Thus, in the circuit 100 the effect of non-linearities in the feedback transistors 140, 142, 144 is negated or attenuated. However, it will be appreciated that the output amplifier 106 in this example could be configured in other ways, for example as a filter or integrator.

Figure 3:
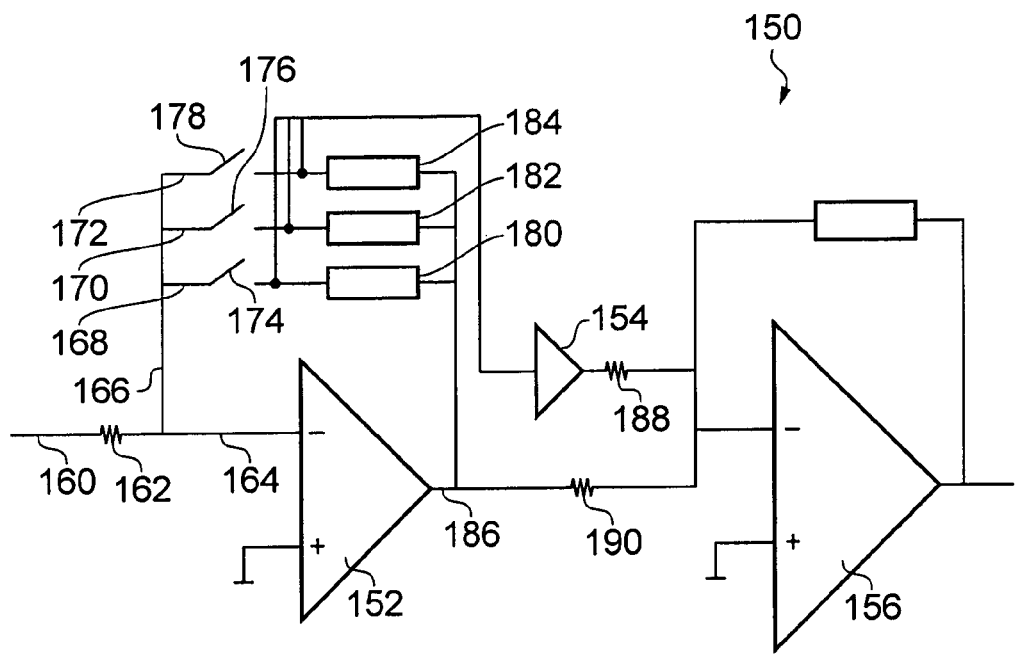
FIG. 3 is a schematic representation of another embodiment of a variable gain amplifier.

FIG. 3 is a schematic illustration of an alternative embodiment of a variable gain amplifier circuit. The circuit, shown generally at 150 in FIG. 3, comprises an input op-amp 152, an intermediate amplifier 154 and an output amplifier 156. The circuit 150 has a single input branch 160 which connects an input of the circuit to an input 164 of the input op-amp 152 via an input resistance 162. A feedback loop 166 has a plurality of parallel feedback paths 138, 170, 172, each containing a transistor 174, 176, 178 configured as a switch in series with a respective feedback impedance 180, 182, 182. By means of the transistors 174, 176, 178, one or more of the feedback impedances can be connected into the feedback loop 166 which connects the input 164 of the input op-amp 152 to an output 182 of the input op-amp 102 so as to select the gain of the variable gain amplifier circuit 150.

As in the circuit 100 described above with reference to FIG. 2, the intermediate amplifier 154 is an inverting unity gain amplifier, and in this example its input can be connected to one or more nodes between the transistors 174, 176, 178 and the feedback impedances 180, 182, 184 by means of transistors 175, 177, 179 which are configured to act as switches.

The transistors 175, 177, 179 in this example are complementary to the transistors 174, 176, 178, such that when feedback impedance 180 is selected by actuating transistor 174, transistor 175 is also actuated, for example.

The output of the intermediate amplifier 154 and the output 186 of the input op-amp 102 are connected respectively to resistances 188, 190 which are in turn connected to an input of the output amplifier 156.

As in the circuit 100 illustrated in FIG. 2, the effect of the intermediate amplifier 154 is to provide a signal which can be used to negate or at least attenuate signal components in the output 186 of the input op-amp 152 which are caused by non-linearities in the transistors 174, 176, 178, and 175, 177, 179 such that the output of the circuit 150 is not affected by any such non-linearities.

Figure 4:
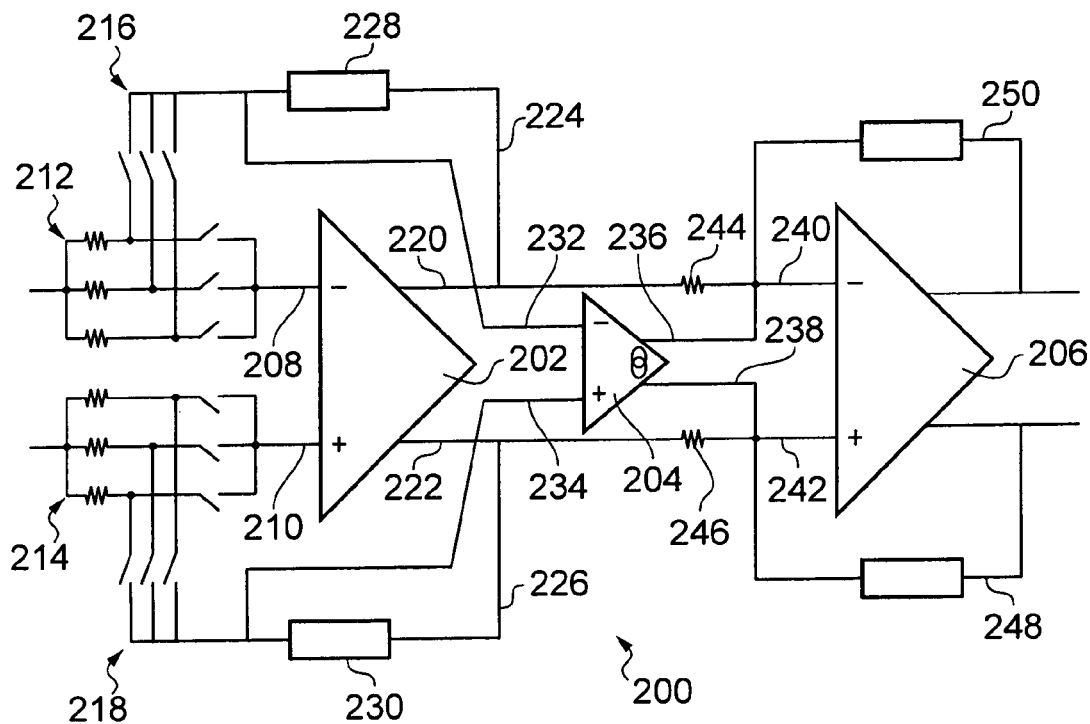
FIG. 4 is a schematic representation of an alternative embodiment of a variable gain amplifier.

Referring now to FIG. 4, a differential amplifier circuit based on the circuit 100 of FIG. 2 is shown generally at 200, and comprises an input op-amp 202, a voltage to current converter 204 and an output op-amp 206. The input op-amp 202 in this embodiment has two inputs 208, 210, each of which is associated with a plurality of input branches 212, 214 and feedback branches 216, 218. The input op-amp 202 has two outputs 220, 222 and two feedback loops 224, 226, the first feedback loop 224 connecting the input 208 to the output 220 via a feedback impedance 228, and the second feedback loop 226 connecting the input 210 to the output 222 via a feedback impedance 230.

The input op-amp 202 works in the same manner as the input op-amp 102 discussed above in relation to the embodiment shown in FIG. 2, with the outputs 220, 222 being affected by signals caused by non-linearities in feedback transistors in the feedback branches 216, 218.

The voltage to current converter 204 has two inputs 232, 234. The first input 232 is connected to a node in the feedback loop 224 between the feedback branches 216 and the feedback impedance 228, whilst the second input 234 is connected to a node in the feedback loop 226 between the feedback branches 218 and the feedback impedance 230. The voltage to current converter 204 is configured as a two-output (fully differential) transconductor with a transconductance of $$g_m = \frac{1}{R_2},$$

where $R_2$ is the resistance of resistors 244, 246 in the output paths of the outputs 220, 222 of the input op-amp 202 (i.e. resistors 244, 246 have the same resistance, $R_2$).

The outputs 236, 238 of the voltage to current converter 204 and the outputs 220, 222 of the input op-amp 202 are directly connected to inputs 240, 242 of the output amplifier 206, whilst the outputs 220, 222 of the input op-amp 202 are connected to the inputs 240, 242 of the output op-amp by the resistors 244, 246. In this example the output amplifier 206 is configured as a fixed-gain amplifier, but it will be appreciated that the amplifier 206 could be configured to perform other functions, for example as an integrator.

The outputs 220, 222 of the input op-amp 202 contain an amplified version of an input signal and signal components caused by non-linearities in feedback transistors of the feedback branches 216, 218. The outputs 236, 238 of the voltage to current converter 204 produce a current which is proportional to the negative of the signal components caused by the non-linearities in the feedback transistors of the feedback branches 216, 218. Thus, as the inputs 240, 242 are connected to the output 220 of the input op-amp 202 and the output 236 of the intermediate op-amp 204 and to the output 222 of the input op-amp 202 and the output 208 of the intermediate op-amp 204 respectively, the currents in feedback loops 248, 250 of the output amplifier 206 are proportional to the signals output by the input op-amp 202 minus the signal components caused by the non-linearities in the feedback transistors. In this way the signal components caused by the non-linearities are negated or attenuated, giving rise to an output signal which is unaffected by the non-linearities in the feedback transistors, or at least in which the contribution caused by the non-linearities of the feedback transistors is reduced.

Figure 5:
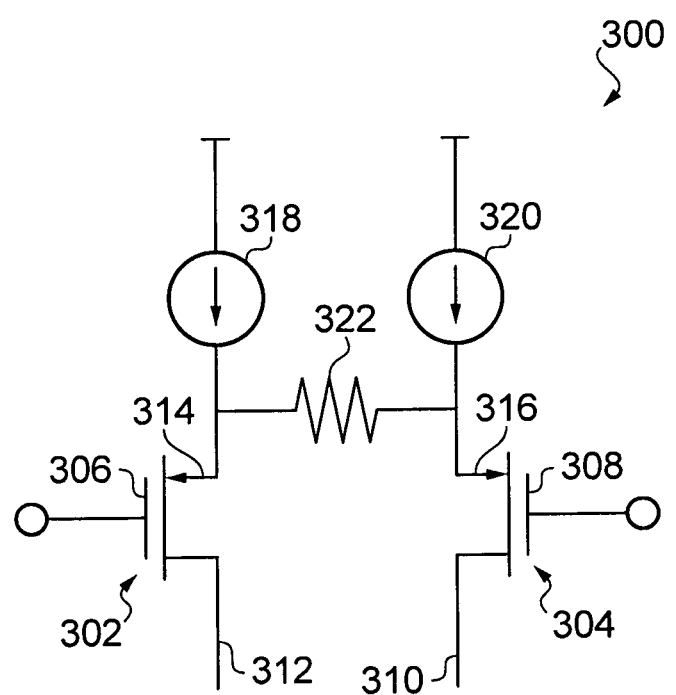
FIG. 5 is a schematic representation of an embodiment of a voltage to current conversion stage suitable for use in the circuit illustrated in FIG. 4.

An example of suitable circuit for the voltage to current converter 204 of the circuit shown in FIG. 4 is shown generally at 300 in FIG. 5. The circuit 300 uses a degenerated pair of transistors 302, 304 whose gates 306, 308 are connected to the inputs 232, 234 respectively of the voltage to current converter. The outputs 236, 238 of the voltage to current converter are provided by the drains 310, 312 of the transistors 302, 304. The sources 314, 316 of the transistors 302, 304 are connected to current sources 318, 320, and are connected to each other by a resistance 322.

In operation of the circuit 300, input signals are received at the gates 306, 308 of the transistors 302, 304. The current through the outputs 310, 312 of the circuit 300 varies in proportion to the difference voltages between the gates 306, 308 of the transistors. It will be appreciated by those of ordinary skill in the relevant art that as the circuit 300 is a fully differential circuit, when the difference voltage between the gates 306, 308 increases, the output current through the drain 310 of transistor 304 increases, while the output current through the drain 312 of transistor 302 decreases.

It will be appreciated that the circuit 300 shown in FIG. 5 is just one exemplary embodiment of a voltage to current converter 204 suitable for use in the circuit 200 shown in FIG. 4, and that the voltage to current converter 204 could be implemented in a variety of ways. Alternative implementations of the voltage to current converter 204 will be familiar to those skilled in the art.

The circuits shown in FIGS. 2, 3, 4 and 5 may be implemented using discrete components, or may be implemented as integrated circuits.

The invention claimed is:

1. A variable gain amplifier circuit comprising an amplifier element having an input and an output;
   a feedback loop having a feedback impedance connected between the input and output of the amplifier element;
   an input branch having an input resistance connected between an input of the variable gain amplifier circuit and the input of the amplifier element; and
   a plurality of switches for selecting a gain of the variable gain amplifier circuit; characterized in that the variable gain amplifier circuit further comprises an intermediate element having an input and an output, the input being connected to a node between one of the switches and the feedback impedance, such that the output can provide a signal which can be used to attenuate a signal component in the output of the amplifier element caused by a non-linearity in the plurality of switches.

2. A circuit according to claim 1 wherein a plurality of parallel input branches are provided, each input branch containing an input resistance and an input switch, such that the gain of the amplifier circuit can be selected by operation of one or more of the input switches.

3. A circuit according to claim 2 wherein the resistance values of the input resistances and the on-resistance values of the corresponding input switches in the input branches are scaled by common scaling factors.

4. A circuit according to claim 2 wherein the input switches comprise transistors.

5. A circuit according to any one of the preceding claims wherein the intermediate element comprises a voltage to current converter.

6. A circuit according to claim 5 wherein the voltage to current converter comprises a degenerated pair of transistors.

7. A circuit according to claim 1 wherein the amplifier element comprises an operational amplifier.

8. A circuit according to claim 1 wherein the circuit is a differential amplifier circuit.

9. An integrated circuit comprising a variable gain amplifier circuit according to claim 1.

* * * * *